US010560060B2

(12) United States Patent
Franck et al.

(10) Patent No.: US 10,560,060 B2
(45) Date of Patent: Feb. 11, 2020

(54) LINEAR CMOS PA WITH LOW QUIESCENT CURRENT AND BOOSTED MAXIMUM LINEAR OUTPUT POWER

(71) Applicant: Qorvo US, Inc., Greensboro, NC (US)

(72) Inventors: Stephen James Franck, Felton, CA (US); Xin Wang, Pleasanton, CA (US); Alireza Oskoui, San Jose, CA (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/578,058

(22) PCT Filed: Apr. 28, 2016

(86) PCT No.: PCT/US2016/029708
§ 371 (c)(1),
(2) Date: Nov. 29, 2017

(87) PCT Pub. No.: WO2016/195859
PCT Pub. Date: Dec. 8, 2016

(65) Prior Publication Data
US 2018/0159484 A1    Jun. 7, 2018

Related U.S. Application Data

(60) Provisional application No. 62/168,366, filed on May 29, 2015.

(51) Int. Cl.
*H03F 3/04* (2006.01)
*H03F 1/32* (2006.01)
(Continued)

(52) U.S. Cl.
CPC ......... *H03F 1/3258* (2013.01); *H03F 1/0205* (2013.01); *H03F 1/223* (2013.01);
(Continued)

(58) Field of Classification Search
CPC ........ H03F 1/3247; H03F 1/3258; H03F 3/24; H03F 1/3241
(Continued)

(56) References Cited

U.S. PATENT DOCUMENTS 9,602,060 B2 * 3/2017 Gorbachov ........... H03F 1/0266
2001/0045867 A1  11/2001 Miyashita et al.
(Continued)

OTHER PUBLICATIONS

"Bult, K., et al., ""A Class of Analog CMOS Circuits Based on the Square-Law Characteristic of an MOS Transistor in Saturation,"" IEEE Journal of Solid-State Circuits, vol. SC-22, No. 3, Jun. 1987, pp. 357-365".
(Continued)

*Primary Examiner* — Khanh V Nguyen
*Assistant Examiner* — Khiem D Nguyen
(74) *Attorney, Agent, or Firm* — Withrow & Terranova, P.L.L.C.

(57) ABSTRACT

The present disclosure relates to a power amplifier (PA) system provided in a semiconductor device and having feed forward gain control. The PA system comprises a transmit path and control circuitry. The transmit path is configured to amplify an input radio frequency (RF) signal and comprises a first tank circuit and a PA stage. The control circuitry is configured to detect a power level associated with the input RF signal and control a first bias signal provided to the PA stage based on a first function of the power level and control a quality factor (Q) of the first tank circuit based on a second function of the power level.

20 Claims, 3 Drawing Sheets

(51) Int. Cl.
*H03F 1/22* (2006.01)
*H03F 1/56* (2006.01)
*H03F 1/02* (2006.01)
*H03F 3/193* (2006.01)
*H03F 3/21* (2006.01)

(52) U.S. Cl.
CPC ............... *H03F 1/56* (2013.01); *H03F 3/193* (2013.01); *H03F 3/21* (2013.01); *H03F 2200/222* (2013.01); *H03F 2200/451* (2013.01); *H03F 2200/465* (2013.01); *H03F 2200/75* (2013.01); *H03F 2200/99* (2013.01)

(58) Field of Classification Search
USPC .......................................... 330/296, 273, 133
See application file for complete search history.

(56) References Cited

U.S. PATENT DOCUMENTS

| | | |
|---|---|---|
| 2005/0088242 A1 | 4/2005 | Behzad |
| 2009/0066439 A1 | 3/2009 | Whelan et al. |
| 2010/0073088 A1 | 3/2010 | Wimpenny et al. |
| 2011/0037519 A1* | 2/2011 | Pletcher .................. H03F 1/086 330/277 |
| 2015/0015339 A1 | 1/2015 | Gorbachov et al. |

OTHER PUBLICATIONS

Chen, Y.-J. E., et al., "A High-Efficient CMOS RF Power Amplifier with Automatic Adaptive Bias Control," IEEE Microwave and Wireless Components Letters, vol. 16, No. 11, Nov. 2006, pp. 615-617.

Jin, S., et al., "Enhanced Linearity of CMOS Power Amplifier Using Adaptive Common Gate Bias Control," 2013 IEEE MTT-S International Microwave Symposium Digest (IMS), Jun. 2-7, 2013, Seattle, Washington, pp. 1-4.

Jin, S., et al., "Linearization of CMOS Cascode Power Amplifiers Through Adaptive Bias Control," IEEE Transactions on Microwave Theory and Techniques, vol. 61, No. 12, Dec. 2013, pp. 4534-4543.

radio-electronics.com, "Quality Factor/Q Factor Tutorial," Available online at: <<http://www.radio-electronics.com/info/formulae/q-quality-factor/basics-tutorial.php>>, Accessed Dec. 9, 2015, 3 pages.

Tsai, T.-C., et al., "A K-band CMOS Power Amplifier with FET-Type Adaptive-Bias Circuit," 2014 Asia-Pacific Microwave Conference (APMC), Nov. 4-7, 2014, Sendai, Japan, pp. 591-593.

International Search Report and Written Opinion for International Patent Application No. PCT/US2016/029708, dated Jul. 21, 2016, 12 pages.

International Preliminary Report on Patentability for International Patent Application No. PCT/US2016/029708, dated Dec. 14, 2017, 10 pages.

\* cited by examiner

US 10,560,060 B2

LINEAR CMOS PA WITH LOW QUIESCENT CURRENT AND BOOSTED MAXIMUM LINEAR OUTPUT POWER

RELATED APPLICATIONS

This application is a 35 USC 371 National Phase filing of PCT/US16/29708, filed Apr. 28, 2016, which claims the benefit of U.S. provisional patent application No. 62/168,366, filed May 29, 2015, the disclosures of which are incorporated herein by reference in their entireties.

FIELD OF THE DISCLOSURE

The present disclosure relates to power amplifier output power level control and linearization based on input power level detection.

BACKGROUND

Many modern electronic devices include wireless communications circuitry for processing and transmitting radio frequency (RF) signals. For example, an electronic device may include wireless local area network (WLAN) circuitry, cellular communications circuitry, or the like. Power amplifiers (PAs) are used to provide amplification for the RF signals. To reduce distortion, a PA may include a closed-loop control system that stabilizes the performance of the PA. Unfortunately, the closed-loop control system often has a limited power range over which it is active. For example, the closed-loop control system is not able to operate and the effectiveness of the closed-loop control system deteriorates going towards small-signal levels as the closed-loop control system becomes inactive. As such, other PAs use feed forward control systems to stabilize performance. Unfortunately, these feed forward control systems suffer from instability due to manufacturing variations, temperature variations, and supply variations. Thus, PAs are needed that can stabilize performance over a wider power range and low quiescent currents. Additionally, PAs are needed that can stabilize performance over different design corners, processes, temperatures, supplies, operating frequencies, and load impedances.

SUMMARY

The present disclosure relates to a power amplifier (PA) system provided in a semiconductor device and having feed forward gain control. The PA system comprises a transmit path and control circuitry. The transmit path is configured to amplify an input radio frequency (RF) signal and comprises a first tank circuit and a PA stage. The control circuitry is configured to detect a power level associated with the input RF signal and control a first bias signal provided to the PA stage based on a first function of the power level and control a quality factor (Q) of the first tank circuit based on a second function of the power level.

In other embodiments, the first and second functions are polynomial functions comprising a linear signal and a quadratic signal. The linear signal is approximately linear to the power level, wherein linear signal has a maximum deviation +10% and −10% from an ideal linear function over a power level range that is between 0.01 milliwatts and 10 milliwatts. The quadratic signal is approximately squared to the power level, wherein quadratic signal has a maximum deviation +10% and −10% from an ideal squared function over the power level range.

In other embodiments, the quadratic signal is attenuated at higher supply voltages. The rate of attenuation at higher supply voltages may be programmable. In other embodiments, the quadratic and/or linear terms may be limited at a combination of high supply voltage and high input power and voltage. In other embodiments, the constant, bias may be attenuated at high supply voltages.

In other embodiments, the control circuitry comprises a first digital-to-analog converter (DAC) providing a constant coefficient of the first function, a second DAC providing a linear coefficient of the first function, and a third DAC providing a quadratic coefficient of the first function. In other embodiments, the control circuitry further comprises a fourth DAC providing a constant coefficient of the second function, a fifth DAC providing a linear coefficient of the second function, and a sixth DAC providing a quadratic coefficient of the second function. In other embodiments, the control circuitry is further adapted to control a second bias signal provided to the PA stage based on a third function of the power level, wherein the third function is also a polynomial function. The PA stage may be a cascode amplifier comprising a first transistor having one of a gate or base coupled to the first bias signal and a second transistor having one of a gate or base coupled to the second bias signal. In other embodiments, the transmit path further comprises a second tank circuit and the control circuitry is further adapted to control a Q of the second tank circuit based on a fourth function of the power level, wherein the third function is also a polynomial function. A first pre-amplifier stage is coupled between the first tank circuit and the second tank circuit. The first and second tank circuits may be passive attenuation stages.

Those skilled in the art will appreciate the scope of the present disclosure and realize additional aspects thereof after reading the following detailed description in association with the accompanying drawings.

BRIEF DESCRIPTION OF THE DRAWINGS

The accompanying drawings incorporated in and forming a part of this Specification illustrate several aspects of the disclosure, and together with the description serve to explain the principles of the disclosure.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

Figure 1:
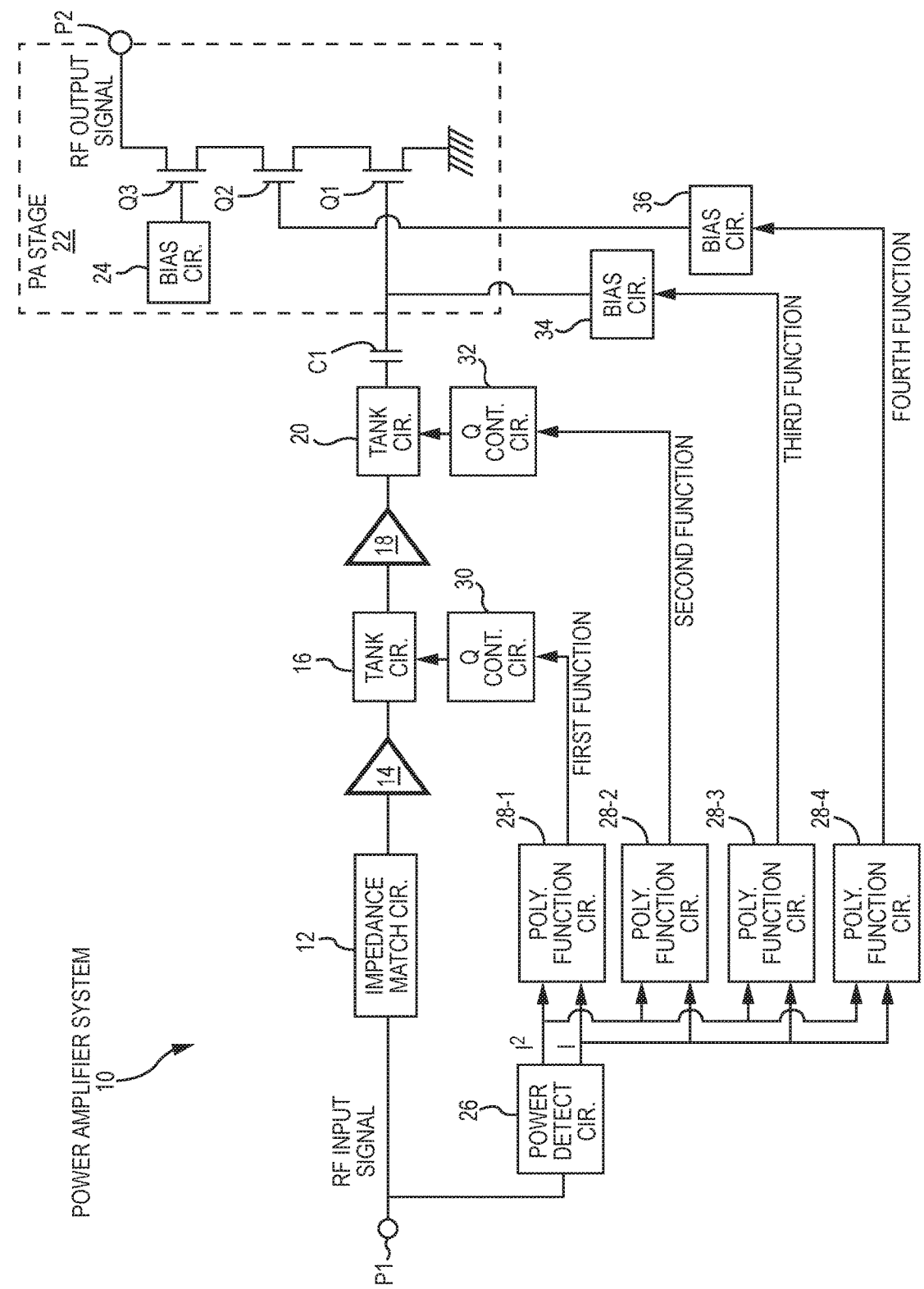
FIG. 1 is a block diagram of a power amplifier system for amplifying a radio frequency (RF) input signal according to the principles of the invention.

FIG. 1 is a block diagram of a power amplifier (PA) system 10 comprising a transmit path and control circuitry. The transmit path is coupled between an input port P1 and an output port P2. The input port P1 is configured to receive an input radio frequency (RF) signal and the output port P2 is configured to provide an RF output signal. The transmit path comprises impedance match circuitry 12, a first pre-amplifier stage 14, a first tank circuit 16, a second pre-amplifier stage 18, a second tank circuit 20, a capacitor C1, and a PA stage 22.

The impedance match circuitry 12 is coupled between the input port P1 and an input of the first pre-amplifier stage 14. The impedance match circuitry 12 is configured to increase power transfer and decrease reflections of the RF input signal into the transmit path. In some embodiments, the input impedance match circuitry 12 may provide a 50 ohm impedance for the input port P1 and a 500 ohm impedance for the first pre-amplifier stage 14. The impedance matching circuitry 12 may comprise a resistor, a capacitor, an inductor, or a combination hereof. In other embodiments, the impedance match circuitry 12 may further comprise at least one transistor. The first pre-amplifier stage 14 is configured to provide a first fixed gain to the transmit path and may comprise at least one transistor. The first tank circuit 16 is coupled between an output of the first preamplifier stage 14 and an input of the second preamplifier stage 18; and is configured to vary a gain of the transmit path. The first tank circuit 16 may be a passive attenuation stage comprising a capacitor, inductor, and a variable resistor. The capacitor may be coupled between the output of the preamplifier stage 14 and a first port of the inductor. A second port of the inductor may be coupled to ground. The variable resistor may be coupled in parallel with the inductor and configured to control a quality factor (Q) of the first tank circuit 16. In some embodiments, the variable resistor may be a field effect transistor (FET), wherein a drain-to-source resistance of the FET is varied with a gate-to-source voltage of the FET. As the drain-to-source resistance of the FET decreases the Q is decreased and the attenuation of the first tank circuit 16 is increased. Q control circuitry 30 is configured to receive a first function and vary the Q of the first tank circuit 16 based on the first function.

The second pre-amplifier stage 18 is configured to provide a second fixed gain to the transmit path. The second pre-amplifier stage 18 may comprise at least one transistor. The second tank circuit 20 is coupled to the output of the second pre-amplifier stage 18 and is configured to further vary the gain of the transmit path. The second tank circuit 20 may be a passive attenuation stage and be configured in a similar manner to the first tank circuit 16. The capacitor C1 couples the second tank circuit 20 to an input of the PA stage 22. The capacitor C1 is configured to provide direct current (DC) isolation for the input to the PA stage 22 from the second tank circuit 20.

The PA stage 22 is configured as a cascode amplifier comprising FETs Q1, Q2, and Q3. The FET Q1 is configured as a common source amplifier and provides a first amplification of the PA stage 22. A gate of FET Q1 provides the input of the PA stage 22. A source of FET Q1 is coupled to a ground and a drain of FET Q1 is coupled to a source of FET Q2. The FET Q2 is configured as common gate amplifier and provides a second amplification of the PA stage 22. A drain of FET Q2 is coupled to a source of FET Q3. The FET Q3 is also configured as common gate amplifier and provides a third amplification of the PA stage 22. A drain of FET Q3 is coupled to the output port P2. Bias circuitry 24 is coupled to a gate of the FET Q3 and is configured to provide a fixed gain of the third amplification. Gates of the FETs Q1 and Q2 are coupled to the control circuitry and are configured to provide variable gains to the first and second amplifications. The output port P2 may be coupled to an inductor (not shown) to provide a bias voltage to the drain of FET Q3. In other embodiments, the output port P2 may be coupled to a resistor or an antenna. In other embodiments, the PA stage 22 may comprise at least one bipolar junction transistor (BJT). The BJT may be configured as a common emitter amplifier and replace the FET Q1. The BJT may also be configured as a common base amplifier and replace the FET Q2 or the FET Q3.

The control circuitry comprises the power detect circuitry 26; polynomial function circuitries 28-1, 28-2, 28-3, and 28-4; Q control circuitries 30 and 32; and bias circuitries 34 and 36. The power detect circuitry 26 is configured to detect a power level associated with the input RF signal. The power detect circuitry 26 is further configured to provide a linear signal I and a quadratic signal $I^2$. The linear signal I is approximately linear to the power level, wherein the linear signal I has a maximum deviation +10% and −10% from an ideal linear function over a power level range that is between 0.01 milliwatts and 10 milliwatts. The quadratic signal $I^2$ is approximately squared to the power level, wherein the quadratic signal $I^2$ has a maximum deviation +10% and −10% from an ideal squared function over the power level range. The linear signal I and the quadratic signal $I^2$ are coupled to the polynomial function circuitries 28-1, 28-2, 28-3, and 28-4.

The polynomial function circuitry 28-1 provides a first function to the Q control circuitry 30, wherein the first function is a polynomial function based on the linear signal I and the quadratic signal $I^2$. The Q control circuitry 30 is configured to vary the Q of the first tank circuit 16 based on the first function. The polynomial function circuitry 28-2 provides a second function to the Q control circuitry 32, wherein the second function is a polynomial function based on the linear signal I and the quadratic signal $I^2$. The Q control circuitry 32 is configured to vary the Q of the second tank circuit 20 based on the second function. The polynomial function circuitry 28-3 provides a third function to the bias circuitry 34, wherein the third function is a polynomial function based on the linear signal I and the quadratic signal $I^2$. The bias circuitry 34 is configured to provide a first bias signal to a gate of the FET Q1 based on the third function, wherein the first bias signal varies a gain of the FET Q1. The polynomial function circuitry 28-4 provides a fourth function to the bias circuitry 36, wherein the fourth function is a polynomial function based on the linear signal I and the quadratic signal $I^2$. The bias circuitry 36 is configured to provide a second bias signal to a gate of the FET Q2 based on the fourth function, wherein the second bias signal varies a gain of the FET Q2.

In other embodiments, the power detect circuitry 38 (as shown in FIG. 1) may be replicated for polynomial function circuitries 28-1, 28-2, 28-3, and 28-4. In other embodiments, the first function may be directly coupled to the first tank circuit 16, the second function may be directly coupled to the second tank circuit 20, the third function may be directly coupled to the gate of the FET Q1, and the fourth function may be directly coupled to the gate of the FET Q2.

Figure 2:
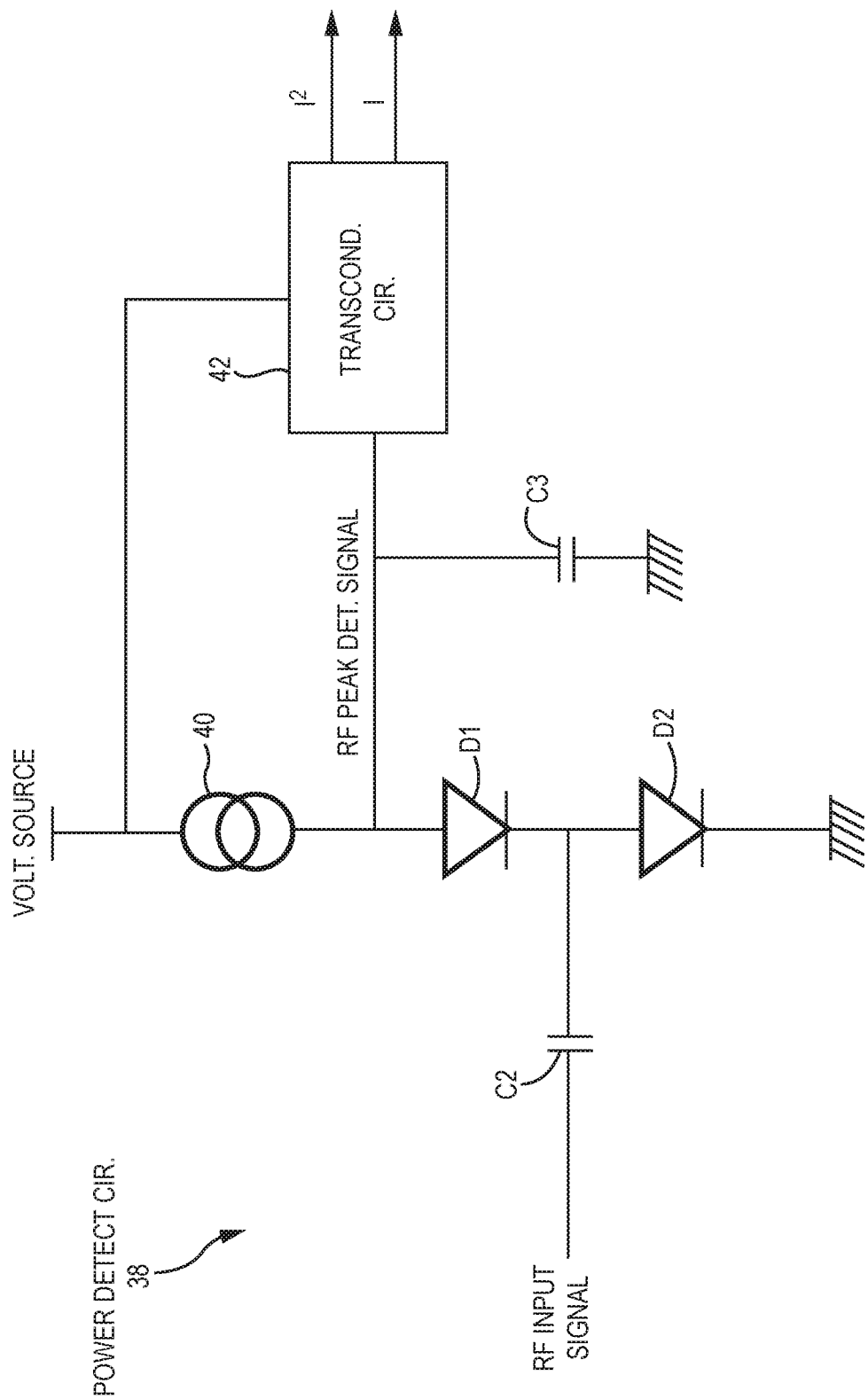
FIG. 2 is a block diagram of power detect circuitry for detecting an input power level of the RF input signal according to the principles of the invention.

FIG. 2 is a block diagram of the power detector circuitry 38. A capacitor C2 is coupled to the RF input signal. The capacitor C2 is also coupled to a cathode of a diode D1 and an anode of a diode D2. A cathode of D2 is coupled to the ground. An anode of diode D1 is coupled to a current source 40 and provides an RF peak detect signal for transconductance circuitry 42. The current source 40 is also coupled to a voltage source.

The diodes D1 and D2 are forward biased by the current source 40 and the voltage source. The diode D1 conducts during a negative half cycle of the RF input signal and the diode D2 conducts during a positive half cycle of the RF input signal. A capacitor C3 is coupled between the RF peak detect signal and the ground. The capacitor C3 is configure to hold a voltage of the RF peak detect signal that is representative of both the positive and negative half cycle of the RF input signal.

The transconductance circuitry 42 is configured to convert the voltage of the RF peak detect signal to a current for the linear signal I and to a current for the quadratic signal $I^2$. The transconductance circuitry 42 may comprise a resistor to provide a voltage to current conversion. In other embodiments, a transconductance amplifier may provide the voltage to current conversion. The transconductance circuitry 42 may further comprise a Wilson current mirror circuit to provide the current for the linear signal I. The transconductance circuitry 42 may further comprise a metal oxide semiconductor FET (MOSFET) to provide the current for the quadratic signal $I^2$ based on a square law characteristic of the MOSFET when in saturation.

Figure 3:
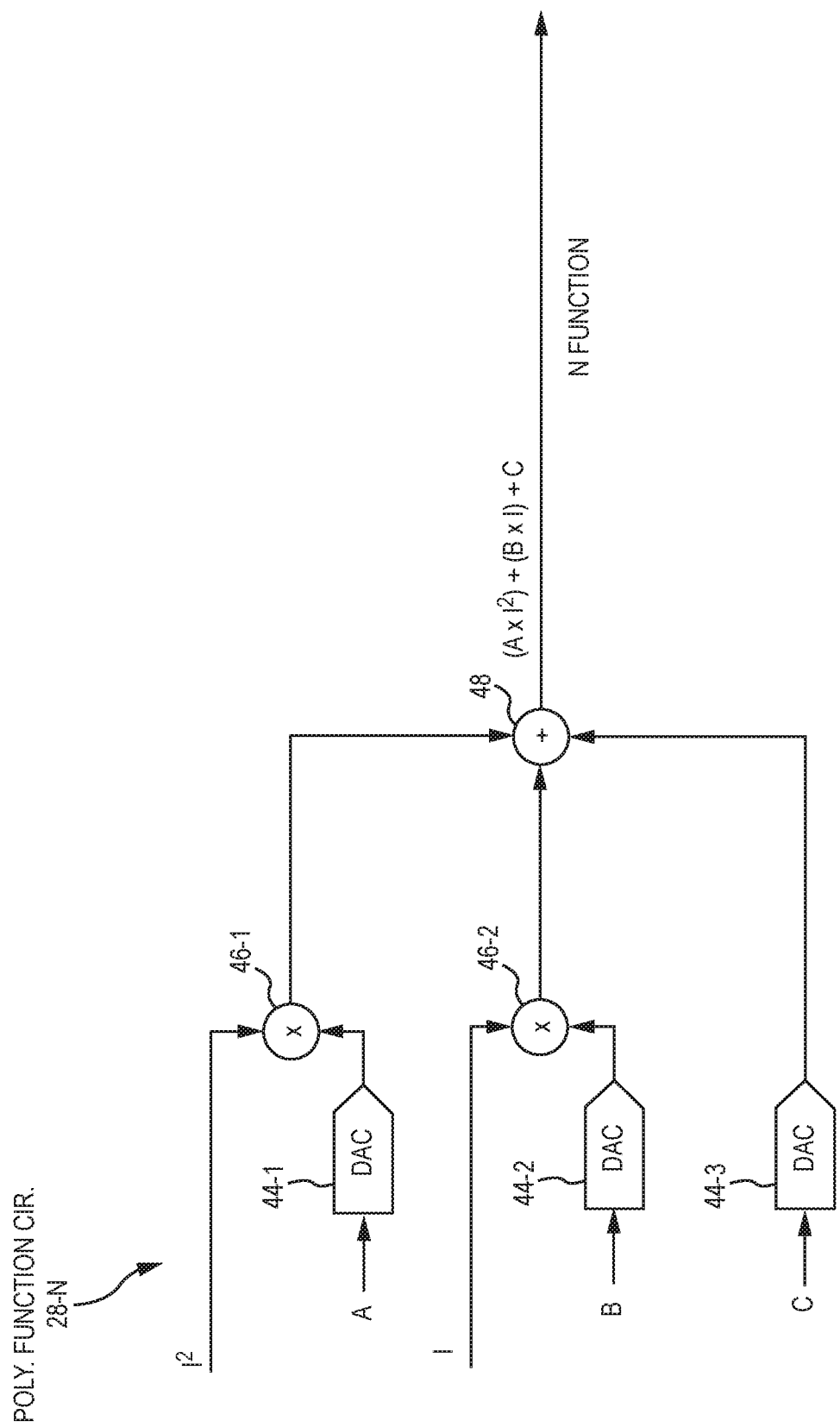
FIG. 3 is a block diagram of polynomial function circuitry according to the principles of the invention.

FIG. 3 is a diagram of polynomial function circuitry 28-$n$ and may be representative of any of polynomial function circuitries 28-1, 28-2, 28-3, and 28-4 of FIG. 2. The polynomial function circuitry 28-$n$ is configured to provide an n function which may be representative of any of the first, second, third, and fourth polynomial function circuitries 28-1, 28-2, 28-3, and 28-4 of FIG. 2. A quadratic coefficient (QC) digital to analog converter (DAC) 44-1 provides a first constant current representative of a programmed input A. A linear coefficient (LC) DAC 44-2 provides a second constant current representative of a programmed input B. A constant coefficient (CC) DAC 44-3 provides a third constant current representative of a programmed input C. A microprocessor (not shown in FIG. 3) may be configured to provide the programmed input A, the programmed input B, the programmed input C, or a combination hereof.

A first current multiplier 46-1 is configured to receive the first constant current and at least a portion of the current for the quadratic signal $I^2$. The first current multiplier 46-1 is further configured to provide a quadratic term current to a current summing function 48. A second current multiplier 46-2 is configured to receive the second constant current and at least a portion of the current for the linear signal I. The second current multiplier 46-2 is further configured to provide a linear term current to the current summing function 48. The current summing function 48 also receives the third constant current and is configured to provide the n-function, wherein the n function is representative of a polynomial equation $(A \times I^2)+(B \times I)+C$. In some embodiments, the current summing function 48 may be a summing node. A Wilson current mirror may be used to isolate the current summing node and provide the n function.

Those skilled in the art will recognize improvements and modifications to the present disclosure. All such improvements and modifications are considered within the scope of the concepts disclosed herein.

What is claimed is:

1. A power amplifier (PA) system comprising:
   a transmit path configured to amplify an input radio frequency (RF) signal, the transmit path comprising:
   a first tank circuit; and
   a PA stage; and
   control circuitry configured to:
   detect a power level associated with the input RF signal;
   control a quality factor (Q) of the first tank circuit based on a first function of the power level; and
   control a first bias signal provided to the PA stage based on a third function of the power level;
   wherein the first function and the third function of the power level are polynomial functions.

2. The PA system of claim 1, wherein the control circuitry is further adapted to control a second bias signal provided to the PA stage based on a fourth function of the power level.

3. The PA system of claim 1, wherein the transmit path further comprises a second tank circuit and the control circuitry is further adapted to control a Q of the second tank circuit based on a second function of the power level.

4. The PA system of claim 3, wherein the second function is a polynomial function.

5. The PA system of claim 3, wherein a first pre-amplifier stage is coupled between the first tank circuit and the second tank circuit.

6. The PA system of claim 5, wherein the first tank circuit and the second tank circuit are passive attenuation stages.

7. A power amplifier (PA) system, comprising:
   a transmit path configured to amplify an input radio frequency (RF) signal, the transmit path comprising:
   a first tank circuit; and
   a PA stage; and
   control circuitry configured to:
   detect a power level associated with the input RF signal;
   control a quality factor (Q) of the first tank circuit based on a first function of the power level;
   control a first bias signal provided to the PA stage based on a third function of the power level; and
   control a second bias signal provided to the PA stage based on a fourth function of the power level.

8. The PA system of claim 7, wherein the first function, the third function, and the fourth function of the power level are polynomial functions.

9. The PA system of claim 7, wherein the PA stage is a cascode amplifier comprising:
   a first transistor having one of a gate or base coupled to the first bias signal; and
   a second transistor having one of a gate or base coupled to the second bias signal.

10. The PA system of claim 7, wherein the transmit path further comprises a second tank circuit and the control circuitry is further adapted to control a Q of the second tank circuit based on a second function of the power level.

11. The PA system of claim 10, wherein the first function, the second function, the third function, and the fourth function of the power level are polynomial functions.

12. The PA system of claim 10, wherein a first pre-amplifier stage is coupled between the first tank circuit and the second tank circuit.

13. The PA system of claim 12, wherein the first tank circuit and the second tank circuit are passive attenuation stages.

14. The PA system of claim 13, wherein the PA stage is a cascode amplifier comprising:
   a first transistor having one of a gate or base coupled to the first bias signal; and
   a second transistor having one of a gate or base coupled to the second bias signal.

15. The PA system of claim 14, wherein the first function, the second function, the third function, and the fourth function of the power level are polynomial functions.

16. A power amplifier (PA) system, comprising:
a transmit path configured to amplify an input radio frequency (RF) signal, the transmit path comprising:
   a first tank circuit; and
   a PA stage; and
control circuitry configured to:
   detect a power level associated with the input RF signal;
   control a quality factor (Q) of the first tank circuit based on a first function of the power level; and
   control a first bias signal provided to the PA stage based on a third function of the power level;
wherein:
   the first function comprises a linear signal that is approximately linear to the power level and a quadratic signal that is approximately squared to the power level; and
   the third function comprises the linear signal and the quadratic signal.

17. The PA system of claim 16, wherein the control circuitry comprises:
   a first digital-to-analog converter (DAC) providing a coefficient of the first function; and
   a second DAC providing a coefficient of the third function.

18. The PA system of claim 16, wherein the control circuitry comprises:
   a first digital-to-analog converter (DAC) providing a constant coefficient of the first function;
   a second DAC providing a linear coefficient of the first function; and
   a third DAC providing a quadratic coefficient of the first function.

19. The PA system of claim 18, wherein the control circuitry further comprises:
   a fourth DAC providing a constant coefficient of the third function;
   a fifth DAC providing a linear coefficient of the third function; and
   a sixth DAC providing a quadratic coefficient of the third function.

20. The PA system of claim 15, wherein:
the first function comprises a linear signal that is approximately linear to the power level and a quadratic signal that is approximately squared to the power level; and
the third function comprises the linear signal and the quadratic signal; and
the control circuitry comprises:
   a first digital-to-analog converter (DAC) providing a constant coefficient of the first function;
   a second DAC providing a linear coefficient of the first function;
   a third DAC providing a quadratic coefficient of the first function;
   a fourth DAC providing a constant coefficient of the third function;
   a fifth DAC providing a linear coefficient of the third function; and
   a sixth DAC providing a quadratic coefficient of the third function.

* * * * *